(12) United States Patent
Takahashi et al.

(10) Patent No.: US 8,901,920 B2
(45) Date of Patent: Dec. 2, 2014

(54) CONNECTOR, PROBE, AND METHOD OF MANUFACTURING PROBE

(75) Inventors: Koki Takahashi, Tokyo (JP); Koki Sato, Tokyo (JP); Mitsuru Kobayashi, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 469 days.

(21) Appl. No.: 13/353,377

(22) Filed: Jan. 19, 2012

(65) Prior Publication Data

US 2012/0194173 A1    Aug. 2, 2012

(30) Foreign Application Priority Data

Jan. 31, 2011  (JP) ................ 2011-019165

(51) Int. Cl.
*G01R 1/06* (2006.01)
*G01R 31/20* (2006.01)
*H01R 13/24* (2006.01)
*H01R 43/16* (2006.01)
*G01R 1/067* (2006.01)
*G01R 1/073* (2006.01)

(52) U.S. Cl.
CPC ........ *G01R 1/06716* (2013.01); *H01R 13/2428* (2013.01); *G01R 1/07307* (2013.01); *H01R 43/16* (2013.01)
USPC ............. 324/149; 324/754.14; 439/700

(58) Field of Classification Search
USPC .............................................. 324/149
See application file for complete search history.

(56) References Cited

U.S. PATENT DOCUMENTS

| | | | | |
|---|---|---|---|---|
| 5,807,123 A | * | 9/1998 | Spiegelaar et al. | 439/188 |
| 6,743,043 B2 | | 6/2004 | Yamada | |
| 6,881,097 B2 | * | 4/2005 | Matsunaga et al. | 439/630 |
| 6,893,269 B2 | * | 5/2005 | Matsunaga | 439/66 |
| 7,150,658 B1 | * | 12/2006 | Chien et al. | 439/700 |
| 8,105,117 B2 | | 1/2012 | Ikegami | |
| 2007/0105407 A1 | * | 5/2007 | Dwan et al. | 439/66 |
| 2010/0285698 A1 | | 11/2010 | Lee | |

FOREIGN PATENT DOCUMENTS

| | | |
|---|---|---|
| JP | H06-065865 U | 9/1994 |
| JP | 2002-246132 | 8/2002 |
| JP | 2007-024664 | 2/2007 |
| JP | 2007-071699 | 3/2007 |
| JP | 2010-532908 | 10/2010 |
| JP | 2010-251255 | 11/2010 |

* cited by examiner

*Primary Examiner* — Bot Ledynh
(74) *Attorney, Agent, or Firm* — IPUSA, PLLC

(57) ABSTRACT

A connector includes multiple probes and a first insulator part and a second insulator part joined to cover the probes. Each of the probes has a monolithic structure of a single bent metal plate. Each of the probes includes an end part configured to come into contact with an electrode terminal; a spring part having a meandering shape and connected to the end part; a housing part bent to enclose the spring part; and a bent part provided between the spring part and the housing part. The end parts of the probes are at least partially projecting outward from first openings provided in the first insulator part, and the bent parts of the probes are at least partially projecting outward from second openings provided in the second insulator part.

8 Claims, 27 Drawing Sheets

CONNECTOR, PROBE, AND METHOD OF MANUFACTURING PROBE

CROSS-REFERENCE TO RELATED APPLICATION

The present application is based upon and claims the benefit of priority of Japanese Patent Application No. 2011-019165, filed on Jan. 31, 2011, the entire contents of which are incorporated herein by reference.

BACKGROUND OF THE INVENTION

1. Field of the Invention

The present invention relates to a connector, a probe, and a method of manufacturing a probe.

2. Description of the Related Art

In manufacturing semiconductor integrated circuits, a measuring apparatus is used for measuring the electric characteristics of semiconductor integrated circuits formed on a wafer. Such a measuring apparatus performs electrical measurements by electrically connecting probes and electrode pads or electrode terminals formed on the wafer by bringing the probes into direct contact with the electrode pads or electrode terminals.

Probes called coil spring probes are commonly used as such probes. The coil spring probe contains a coil spring inside a tubular cylindrical body. One end of the coil spring forms the contact terminal of the probe to come into contact with an electrode pad or an electrode terminal formed on the wafer. The other end of the coil spring is electrically connected to the measuring apparatus. Regarding the coil spring probe, the coil spring is provided in the cylindrical body to allow the contact terminal of the probe to be extended or compressed, so that the electrical contact with the electrode pad or electrode terminal is ensured.

Using two or more of such probes, it is possible to manufacture a connector for establishing an electrical connection.

For related art, reference may be made to Japanese Laid-Open Patent Application No. 2007-24664 and Japanese Laid-Open Patent Application No. 2007-71699.

SUMMARY OF THE INVENTION

According to an aspect of the invention, a connector includes a plurality of probes; and a first insulator part and a second insulator part joined to cover the probes, wherein each of the probes has a monolithic structure of a single bent metal plate, each of the probes including an end part configured to come into contact with an electrode terminal; a spring part having a meandering shape and connected to the end part; a housing part bent to enclose the spring part; and a bent part provided between the spring part and the housing part, and the end parts of the probes are at least partially projecting outward from first openings provided in the first insulator part, and the bent parts of the probes are at least partially projecting outward from second openings provided in the second insulator part.

According to an aspect of the invention, a probe includes an end part configured to come into contact with an electrode terminal; a spring part having a meandering shape and connected to the end part; a housing part bent to enclose the spring part; and a bent part provided between the spring part and the housing part, wherein the end part, the spring part, the housing part, and the bent part are formed in a single bent metal plate and continue from a first end to a second end of the single bent metal plate.

According to an aspect of the invention, a connector includes a plurality of probes, the probes each being the probe as set forth above; and a first insulator part and a second insulator part joined to cover the probes, wherein the end parts of the probes are at least partially projecting outward from first openings provided in the first insulator part, and the bent parts of the probes are at least partially projecting outward from second openings provided in the second insulator part.

According to an aspect of the invention, a method of manufacturing a probe includes processing a metal plate into a predetermined shape so that a first region to become an end part to come into contact with an electrode terminal, a second region to become a spring part having a meandering shape, and a third region to become a housing part enclosing the spring part continue from a first end to a second end of the metal plate; and bending the metal plate, the bending including forming a bent part by bending a boundary between the second region and the third region substantially 180°; and forming the housing part by so bending the third region as to enclose the spring part with the housing part, after forming the bent part.

The object and advantages of the embodiments will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
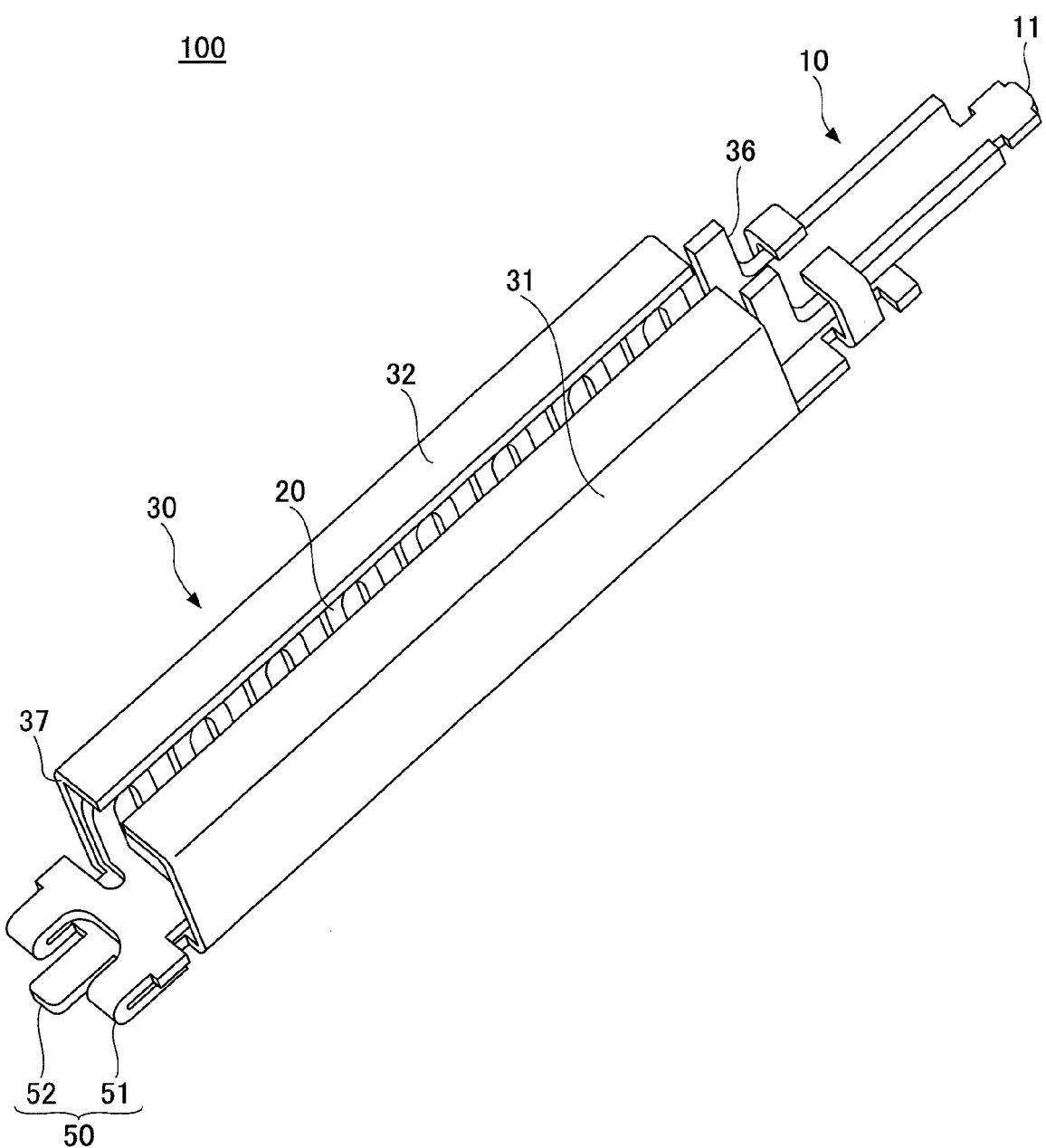
FIG. 1 is a perspective view of the exterior of a probe according to a first embodiment.

In general, the above-described coil spring probe includes the contact portion of the probe, a coil spring, and a cylindrical body, which are manufactured as separate parts to be assembled into the coil spring probe, so that the coil spring probe is thus manufactured. This complicates the manufacturing process and increases the manufacturing cost of the coil spring probe.

According to an aspect of the present invention, a probe for an electrical connection having a spring function is provided that is manufactured in a short period of time at low cost. Further, a method of manufacturing such a spring probe is provided, and a connector using multiple such spring probes is provided.

According to an aspect of the present invention, a probe for an electrical connection having a spring function is provided that is manufactured in a short period of time at low cost without an assembling process because the probe is manufactured by processing a single metal plate. Further, a low-cost, highly-reliable connection is provided using multiple such probes.

A description is given below, with reference to the accompanying drawings, of embodiments of the present invention.

[a] First Embodiment

A description is given of a first embodiment. The first embodiment is a probe, which is used as part of a connector to be described below.

[Probe Structure]

A description is given of a probe according to this embodiment. A probe according to this embodiment, which is used for testing electronic components or electric circuits, is for establishing an electrical connection to an electrode pad or an electrode terminal, which may be simply referred to as "electrode terminal" or "electrode terminal or the like," formed on electronic components or electric circuits.

For example, a probe according to this embodiment is formed by bending a single metal plate, which may be blanked out of a metal plate formed of copper or an alloy containing copper. Accordingly, a probe according to this embodiment has a monolithic structure, continuous as a whole.

A description is given, with reference to FIG. 1 through FIG. 8, of a probe according to this embodiment.

A probe 100 according to this embodiment includes an end part 10, a spring part 20, a housing part 30, and a bent part 50.

Figure 2:
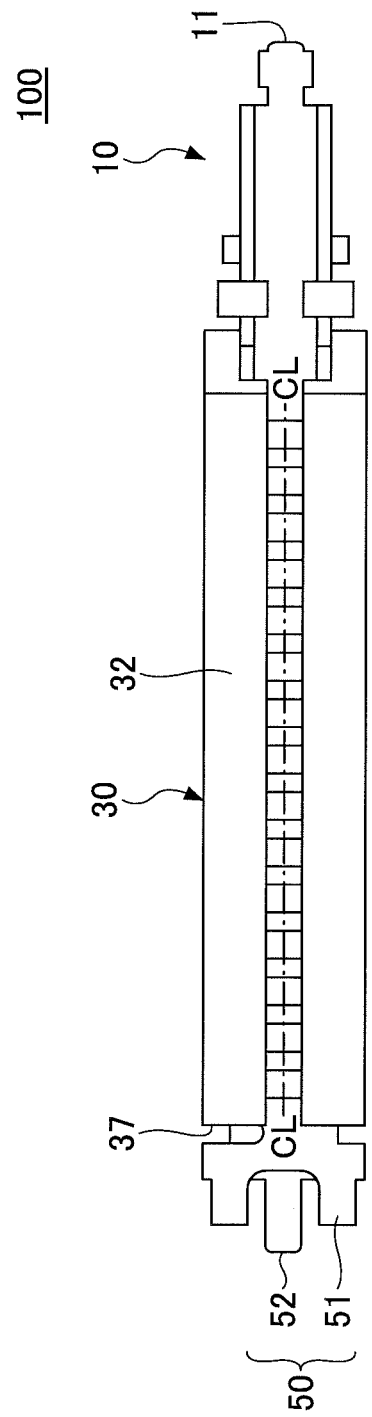
FIG. 2 is a plan view of the exterior of the probe according to the first embodiment.
Figure 3:
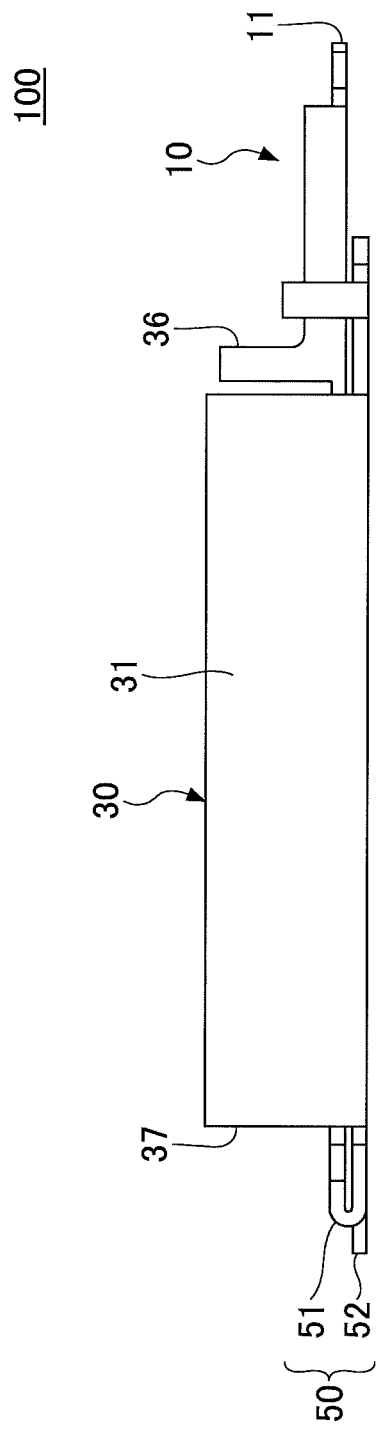
FIG. 3 is a left side view of the exterior of the probe according to the first embodiment.
Figure 4:
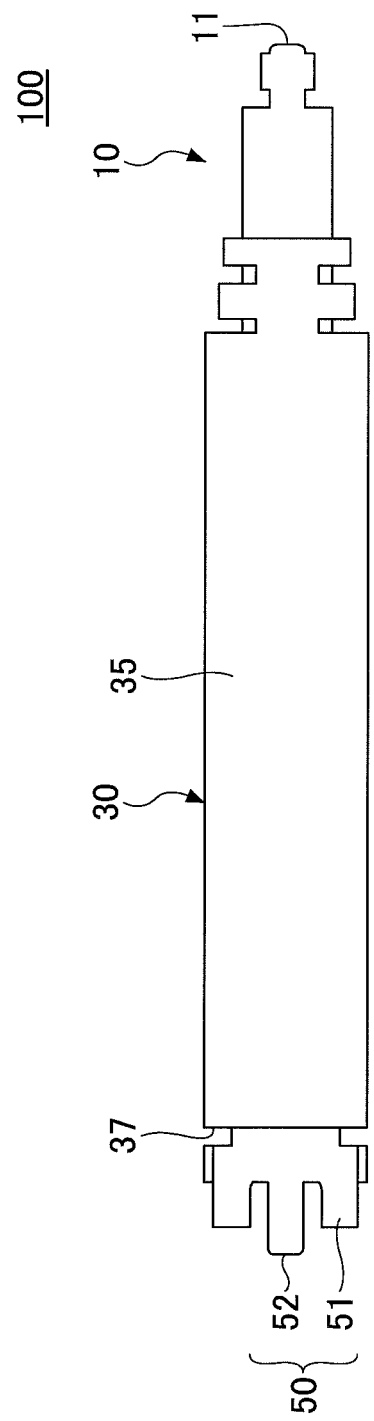
FIG. 4 is a bottom view of the exterior of the probe according to the first embodiment.
Figure 5:
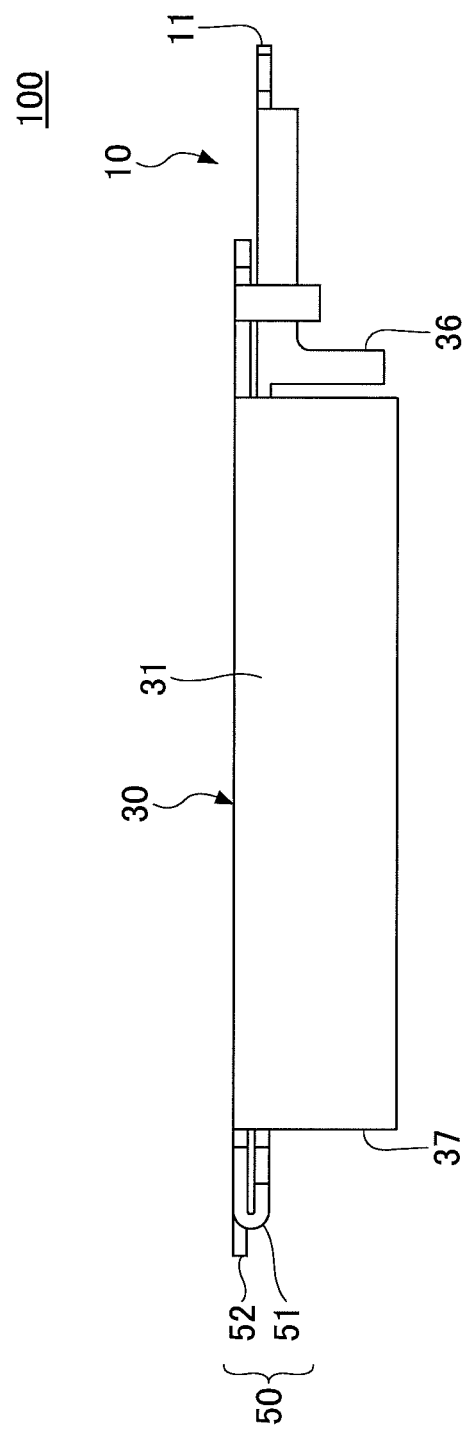
FIG. 5 is a right side view of the exterior of the probe 100 according to the first embodiment.
Figure 6:
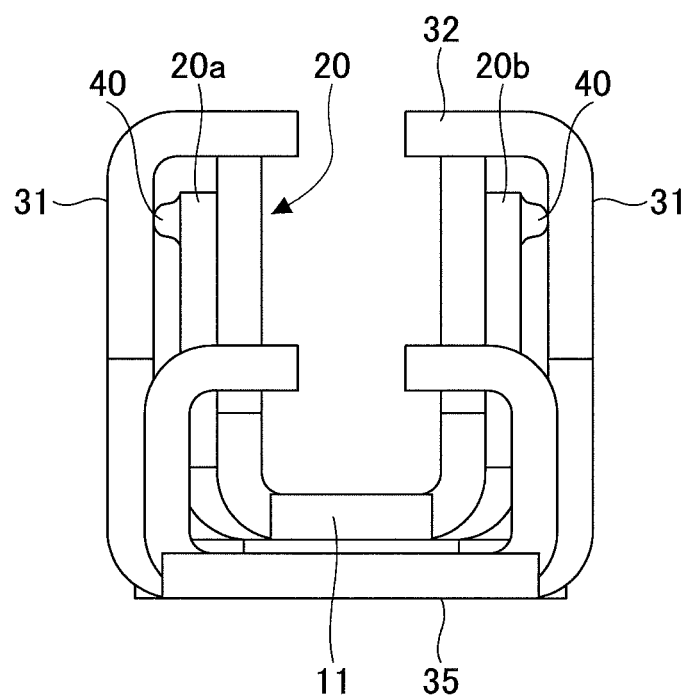
FIG. 6 is a front view of the exterior of the probe according to the first embodiment.
Figure 7:
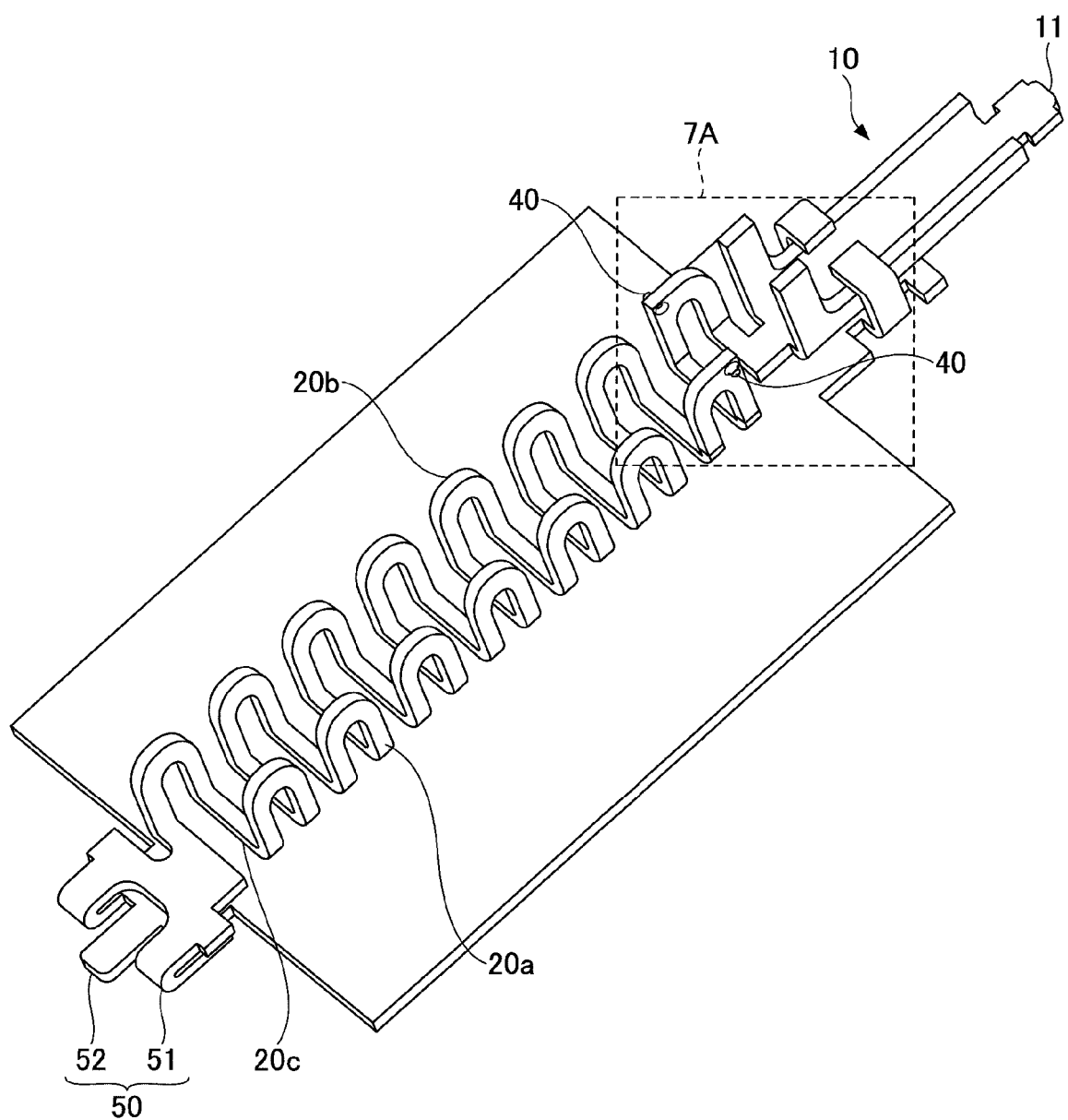
FIG. 7 is a diagram illustrating the probe according to the first embodiment.
Figure 8:
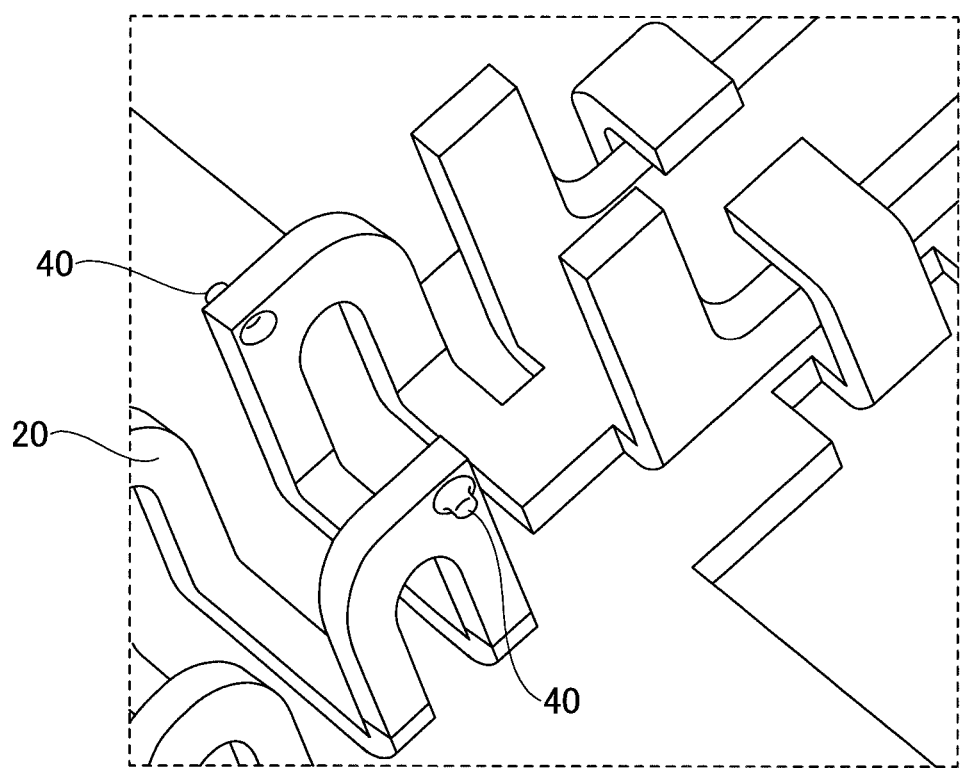
FIG. 8 is an enlarged view of part of the probe according to the first embodiment.

FIG. 1 is a perspective view of the probe 100 according to this embodiment. FIG. 2 is a plan view of the probe 100 according to this embodiment. FIG. 3 is a left side view of the probe 100 according to this embodiment. FIG. 4 is a bottom view of the probe 100 according to this embodiment. FIG. 5 is a right side view of the probe 100 according to this embodiment. FIG. 6 is a front view of the probe 100 according to this embodiment. FIG. 7 is a diagram illustrating an intermediate state of the probe 100 before forming the housing part 30 by bending during its manufacturing process. FIG. 8 is an enlarged view of a region 7A defined by a broken line in FIG. 7.

The end part 10 is configured to come into contact with and electrically connect to an electrode pad or an electrode terminal of an electric circuit or an electronic component formed on a wafer. The end portion of the end part 10 defines a terminal contact portion 11. The terminal contact portion 11 is a part to come into contact with and electrically connect to an electrode pad or an electrode terminal in an electric circuit or an electronic component to be tested.

The spring part 20 includes a first bent portion 20a, a second bent portion 20b, and a (substantial) center portion 20c. The first bent portion 20a and the second bent portion 20b, which are raised from a first side and a second side, respectively, of the center portion 20c, define a first side and a second side, respectively, of the spring part 20 along its lengthwise (longitudinal) direction.

The spring part 20 is formed by bending a meandering plate-shaped part of a metal plate, having U-shaped portions on each side of a substantial center portion, from each side along its lengthwise direction into an angular C-letter shape, so that the bent portion on one side (the first bent portion 20a) and the bent portion on the other side (the second bent portion 20b) of the spring part 20 are substantially parallel to each other.

According to this embodiment, the spring part 20 is illustrated as being bent to have an angular C-letter shape. However, the spring part 20 may also be bent to have a U-letter shape or the like. The spring part 20 has a meandering shape, making U-letter curves on each side along its lengthwise direction. This allows the spring part 20 to have elasticity and to function as a spring.

The housing part 30 is formed by bending a region (part) of the metal plate which region is to become the housing part 30 so that the bent region encloses the entire spring part 20. For example, the housing part 30 includes side surface portions 31 and a top surface portion 32, which are formed by bending the region to become the housing part 30 of the metal plate.

According to the housing part 30, the top surface portion 32 is formed by bending each side portion of the region to become the housing part 30, and a bottom surface portion 35 is also formed at the same time by forming the side surface portions 31 by bending. This allows the entire spring part 20 to be enclosed with the housing part 30 having a substantially quadrangular shape.

The bent part 50 connects the housing part 30 and the spring part 20, serving as a boundary between the housing part 30 and the spring part 20. The bent part 50 is bent approximately 180°, so that the spring part 20 is contained in the housing part 30. The bent part 50 is configured to be electrically connected to a measuring apparatus such as a prober.

An electrode signal obtained at the terminal contact portion 11 by its contact with an electrode pad or an electrode terminal is transmitted to the measuring apparatus via the bent part 50. Therefore, the bent part 50 includes a bent portion 51, which is bent, and an electrode contact portion 52 to come into contact with an electrode terminal. The electrode signal is transmitted to the measuring apparatus via the electrode contact portion 52.

According to this embodiment, projecting parts 40 projecting toward the housing part 30 are provided on the spring part 20 on its end part 10 side. The projecting parts 40 are formed by applying a force from inside to outside at predetermined positions on the spring part 20. Referring to FIG. 6, the projecting parts 40 are so formed as to come into contact with the inside of the side surface portions 31 of the housing part 30 with the housing part 30 being bent from the state illustrated in FIG. 7 to the state illustrated in FIG. 1. As a result, the projecting parts 40 are in contact with the inside of the housing part 30 so that the inside of the housing part 30 and the projecting parts 40 are electrically connected.

As a result of this electrical connection between the inside of the housing part 30 and the projecting parts 40, an electrical signal is transmitted from the terminal contact portion 11 of the end part 10 to the bent part 50 via the projecting parts 40, provided on the side surfaces of the spring part 20, and the housing part 30. The housing part 30 has a large cross-sectional area in a region where the electrical signal flows. This makes it possible to reduce the electrical resistance between the terminal contact portion 11 and the bent part 50. Accordingly, it is possible to transmit an electrical signal detected at the terminal contact portion 11 to the bent part 50 with low resistance. That is, according to the probe 100 of this embodiment, the electrical connection (contact) made inside the probe 100 is limited to where the inside of the side surface portions 31 of the housing part 30 and the projecting parts 40 provided on the spring part 20 are electrically connected. Therefore, the probe 100 is low in contact resistance, so that the probe 100 is also low in electrical resistance.

It is preferable that the projecting parts 40 be provided on a portion of the spring part 20 on its end part 10 side. This is because it is possible to transmit an electrical signal detected at the contact terminal portion 11 with low resistance by causing the electrical signal to be transmitted through the housing part 30 as much as possible since the housing part 30 has such a large cross-sectional area in a region where the electrical signal flows as to allow the electrical signal to flow with low resistance.

Further, it is preferable that the projecting parts 40 be provided one on each side of the bent spring part 20. For example, the projecting parts 40 are provided on the first side and the second side, respectively, of the bent spring part 20, so that the projecting part 40 provided on the first side of the spring part 20 comes into contact with the inside of one of the side surface portions 31 of the housing part 30 and the projecting part 40 provided on the second side of the spring part 20 comes into contact with the inside of the other one of the side surface portions 31 of the housing part 30.

This is because by thus providing the projecting parts 40 one on each side of the spring part 20, it is possible to further ensure the contact of the projecting parts 40 with the housing part 30. In this case, it is preferable that the projecting parts 40 be provided at symmetrical positions (for example, symmetrical with respect to a longitudinal center line CL of the spring part 20 indicated by a one dot chain line in FIG. 2) in the spring part 20 as illustrated in FIG. 8. Providing the projecting parts 40 at such positions makes it possible to further ensure the contact between the projecting parts 40 and the inside of the side surface portions 31 of the housing part 30.

Further, according to the probe 100 of this embodiment, the spring part 20 has a plate shape before the spring part 20 is bent. Therefore, the spring part 20 has a spring characteristic relative to directions in which the spring part 20 is bent at the time of formation of the spring part 20. Accordingly, by bending the spring part 20 into a predetermined shape at the time of formation of the spring part 20, it is possible to ensure contact at the projecting parts 40 with a force being applied to the inside of the side surface portions 31 of the housing part 30. Therefore, it is possible for the spring part 20 to be compressed with the projecting parts 40 and the inside of the side surface portions 31 of the housing part 30 remaining in contact when the terminal contact portion 11 of the end part 10 comes into contact with a terminal provided on a board.

The probe 100 of this embodiment may be further reduced in size because the projecting parts 40 come into contact with the inside of the side surface portions 31 of the housing part 30.

Further, the probe 100 of this embodiment includes a connection front part 36 and a connection rear part 37. For example, the connection rear part 37 is provided at an end of the housing 30 on the bent part 50 side, and the connection front part 36 is provided between the end part 10 and the spring part 20.

In this embodiment, a description is given of the case where the housing part 30 has a substantially quadrangular cross-sectional shape, while it is also possible for the housing part 30 to have a cross section having a polygonal shape such as a substantially circular, elliptical, or triangular shape by bending the housing part 30 in such a manner as to curve the surface of the housing part 30.

Such a probe according to this embodiment may be used for a memory tester, a test of liquid crystal panels, and a probe for a board test, and may replace a probe pin that is also called "pogo pin."

[Method of Manufacturing Probe]

Figure 9:
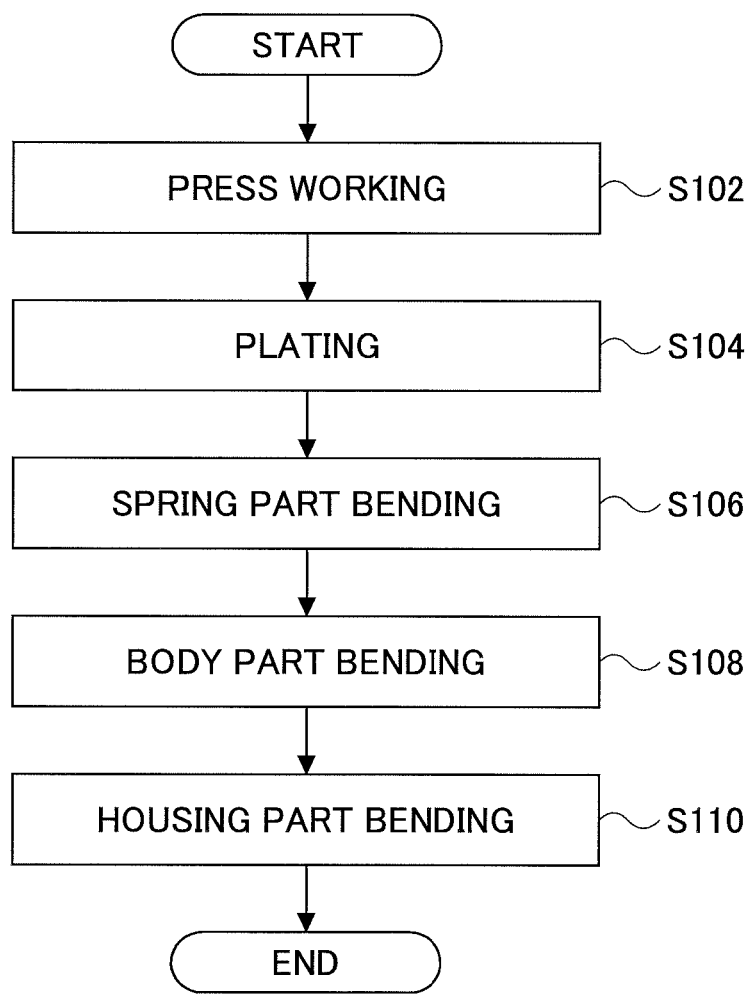
FIG. 9 is a flowchart of a method of manufacturing a probe according to the first embodiment.

Next, a description is given, with reference to FIG. 9, of a method of manufacturing a probe according to this embodiment.

First, in step S102, a metal plate is formed (processed) into a predetermined shape in order to manufacture a probe according to this embodiment (a metal plate forming process). The metal plate may be blanked out by press working or be formed by forming a mask of a predetermined shape on a metal plate and etching off a region of the metal plate where the mask is not formed. This metal plate is formed of copper or an alloy containing copper, and is 30 μm to 150 μm in thickness. According to this embodiment, the metal plate of a predetermined shape is formed by press working using a copper plate of 60 μm in thickness. In this embodiment, this metal plate before being processed into a probe is referred to as a body part.

Next, in step S104, the body part for forming a probe according to this embodiment is subjected to plating (a plating process). This plating is performed by successively performing Ni plating, Pd plating, and Au plating or successively performing Ni plating and Au plating.

Next, in step S106, a region of the body part to become the spring part 20 is bent (a first bending process). For example, the region to become the spring part 20 is bent from each side into an angular C-letter shape to form the spring part 20.

Next, in step S108, the body part for forming a probe according to this embodiment is bent (a second bending process). The body part is bent substantially 180° at the bent portion 51 of the bent part 50. As a result, a structure having a shape as illustrated in FIG. 7 is manufactured.

Next, in step S110, a region of the body part to become the housing part 30 is bent (a third bending process). For example, the region to become the housing part 30 is bent 90° in the same directions as the spring part 20 is bent, so that the side surface portions 31 of the housing part 30 are formed. At this point, the bottom surface portion 35 also is formed at the same time. Therefore, the entire spring part 20 is enclosed by the housing part 30. Further, the inner wall surfaces of the side surface portions 31 of the housing part 30 and the projecting parts 40 (housing connecting parts) come into contact to be electrically connected. The probe according to this embodiment may be manufactured in this manner.

Thus, a probe according to this embodiment may be formed by processing a single metal plate. Accordingly, a probe having a spring function may be manufactured without assembling multiple parts or components, thus requiring no assembling process. Further, the manufacturing process of the probe of this embodiment may be composed of a processing process such as press working on a metal plate, a plating process, and bending processes. Therefore, a probe according to this embodiment may be manufactured with a simple manufacturing apparatus. Further, since the manufacturing process is simple, it is possible to manufacture a large number of probes in a short period of time at low cost. Accordingly, it is possible to manufacture a probe having a spring function at extremely low cost.

[b] Second Embodiment

Next, a description is given of a second embodiment. This embodiment is a connector, which includes multiple probes having the same structure as the probe 100 of the first embodiment. The connector is used as a tester connector for semiconductor devices such as memories and as a board testing connector for semiconductor substrates where electronic circuits and the like are formed.

Referring to FIG. 10 through FIG. 21, a connector according to this embodiment includes a first insulator part 110, a second insulator part 120, and the multiple probes 100 fixed by the first insulator part 110 and the second insulator part 120.

Figure 10:
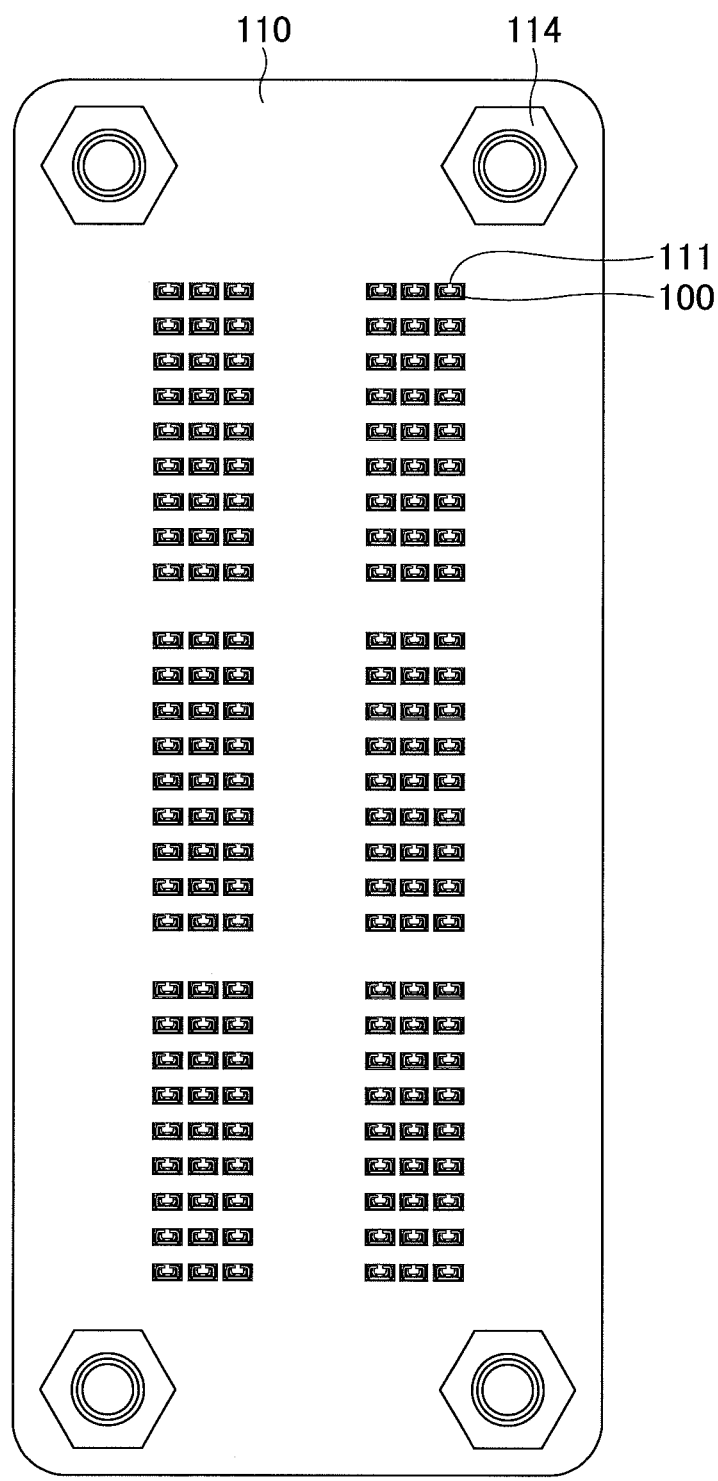
FIG. 10 is a front view of a connector according to a second embodiment.
Figure 11:
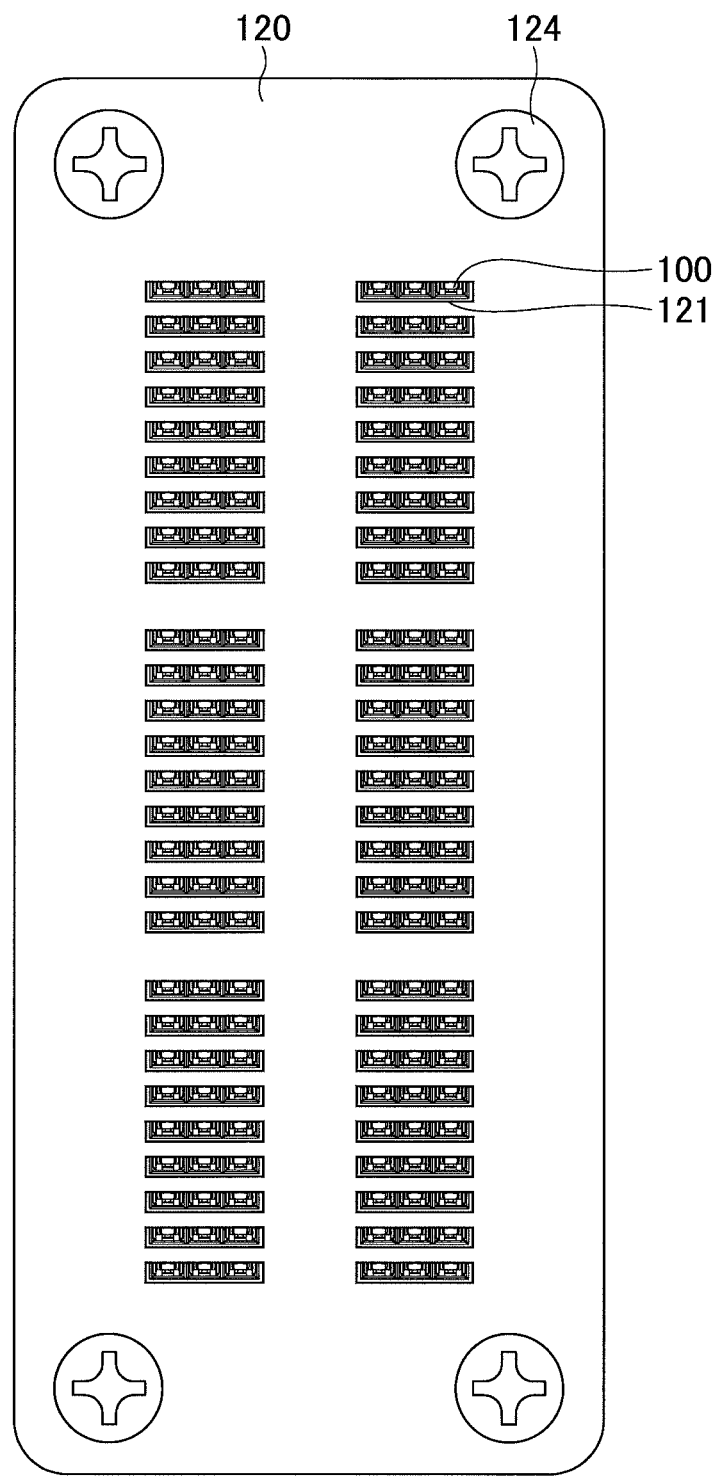
FIG. 11 is a rear view of the connector according to the second embodiment.
Figure 12:
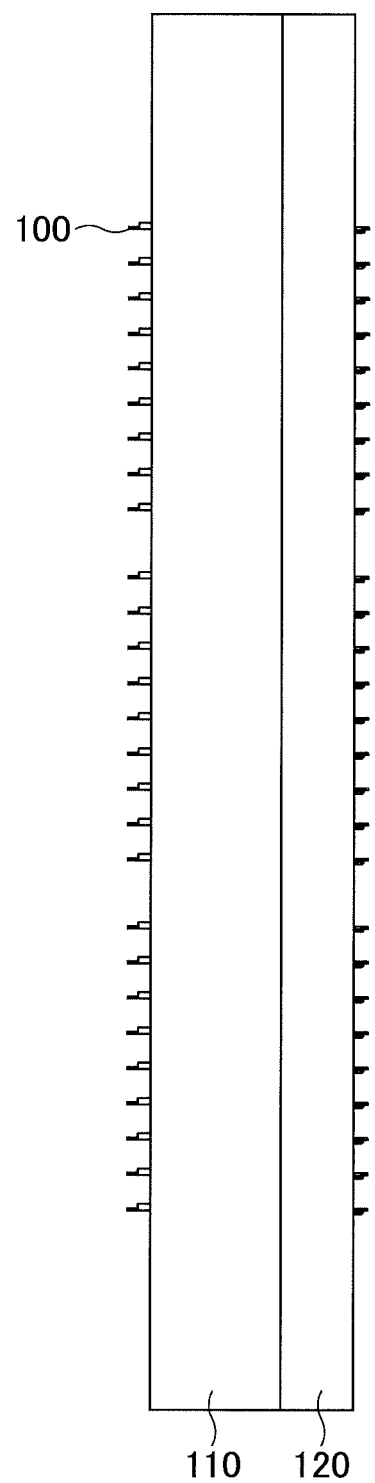
FIG. 12 is a side view of the connector according to the second embodiment.
Figure 13:
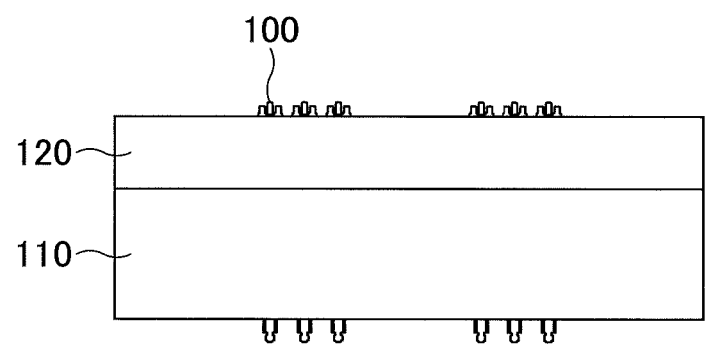
FIG. 13 is a plan view of the connector according to the second embodiment.
Figure 14:
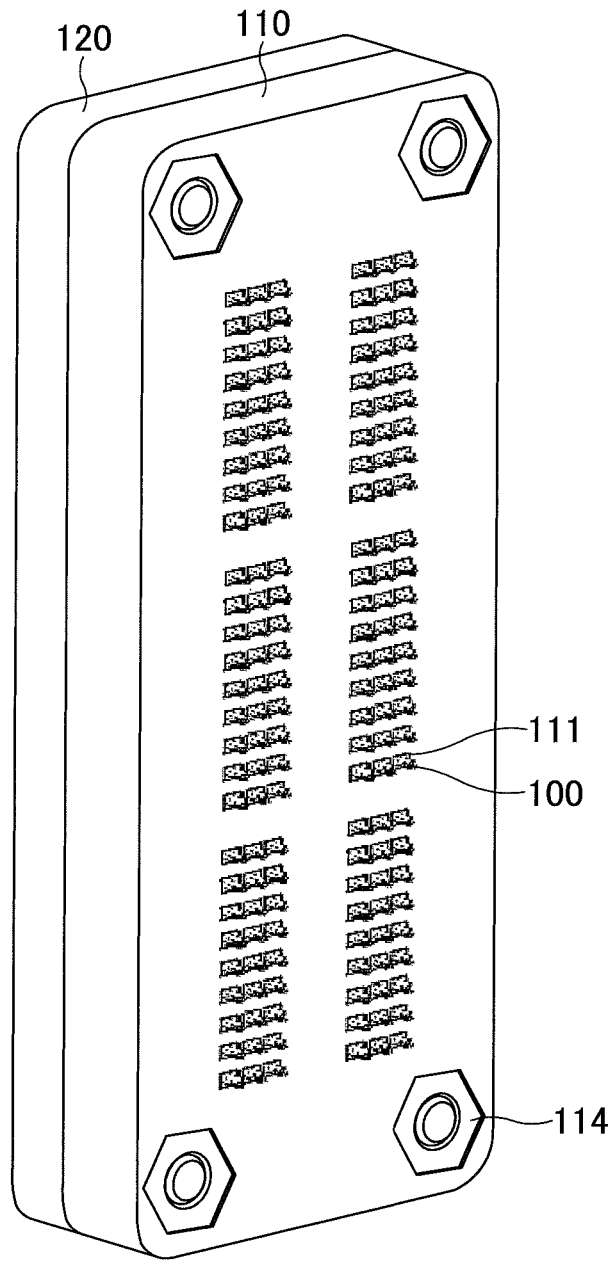
FIG. 14 is a front-side perspective view of the connector according to the second embodiment.
Figure 15:
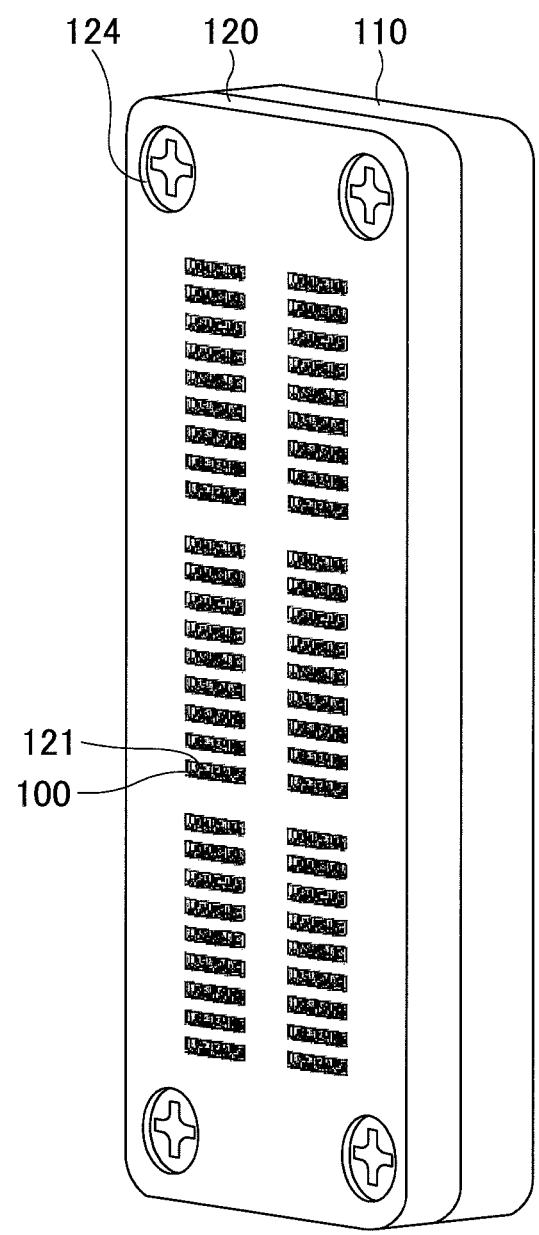
FIG. 15 is a rear-side perspective view of the connector according to the second embodiment.
Figure 16:
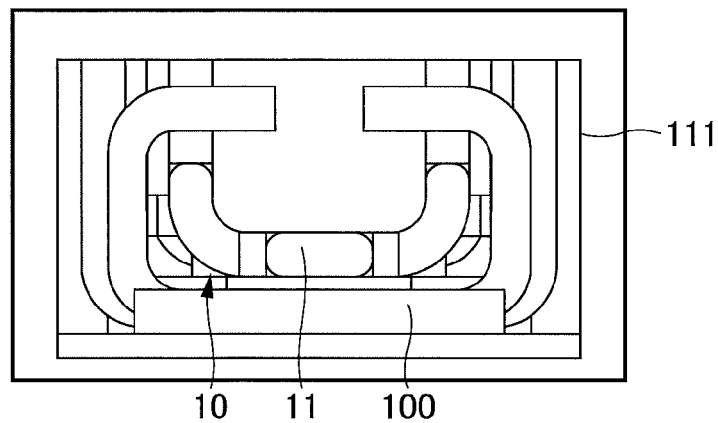
FIG. 16 is an enlarged view of the connector at an opening according to the second embodiment.
Figure 17:
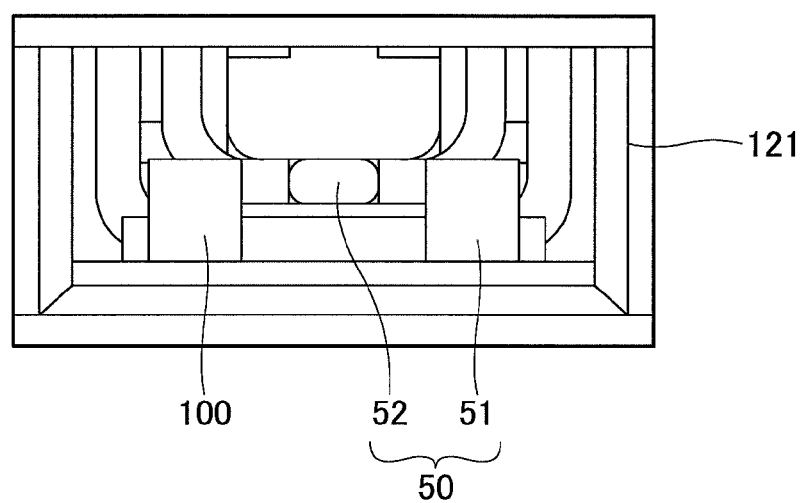
FIG. 17 is an enlarged view of the connector at another opening according to the second embodiment.
Figure 18:
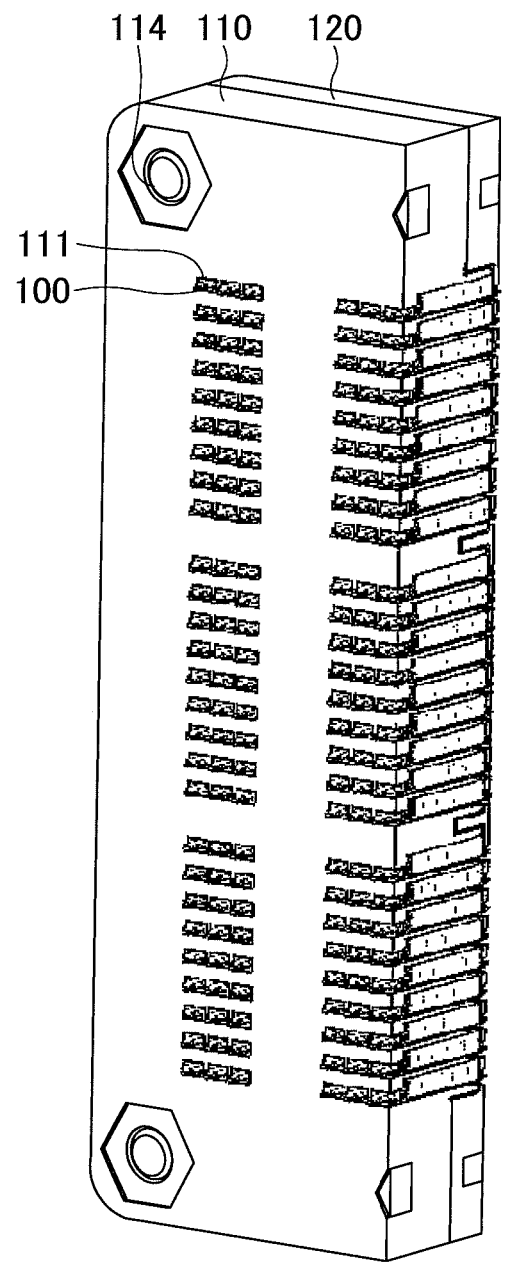
FIG. 18 is a perspective view of the connector with a part of the connector cut off according to the second embodiment.
Figure 19:
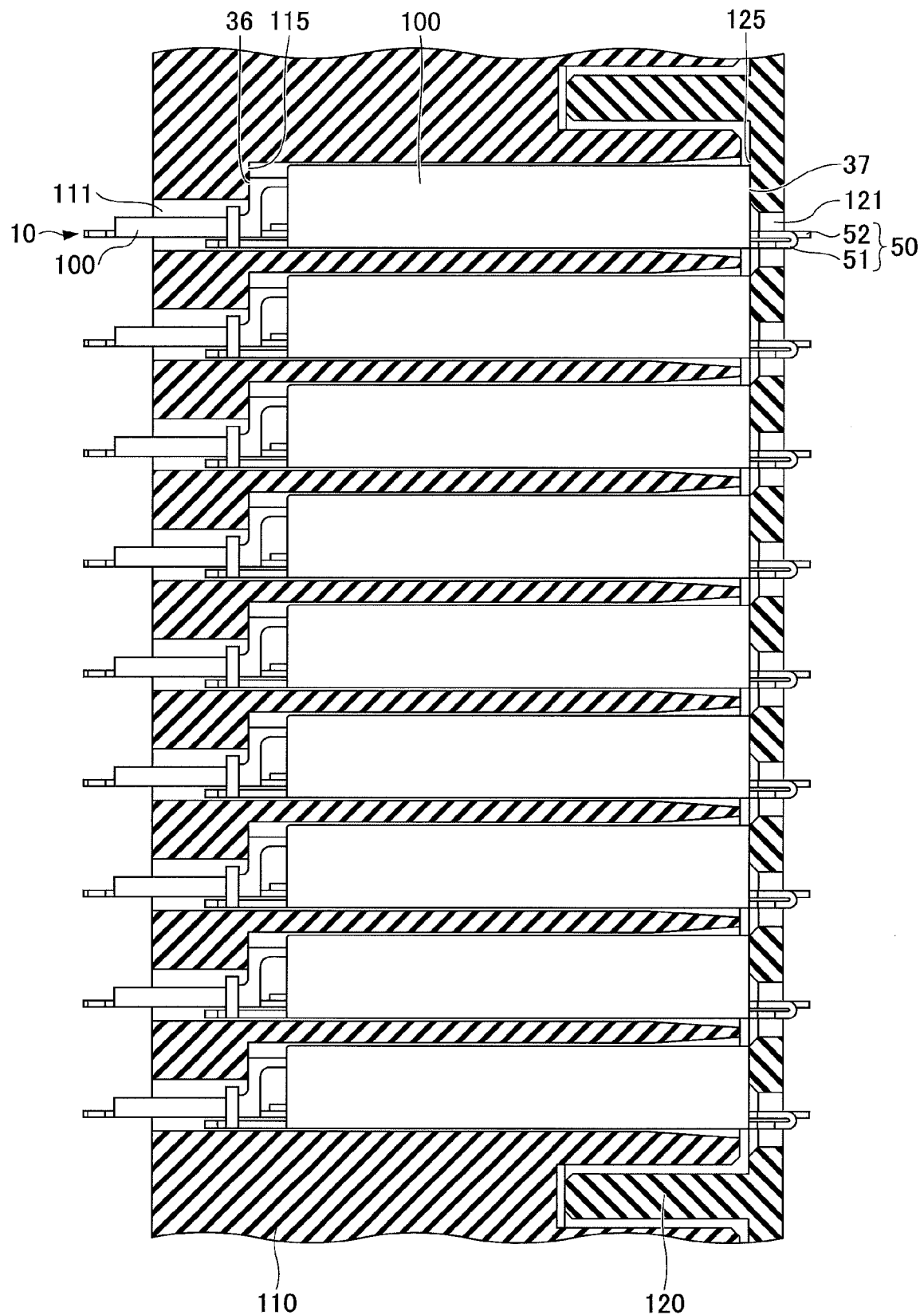
FIG. 19 is a cross-sectional view of the connector according to the second embodiment.
Figure 20:
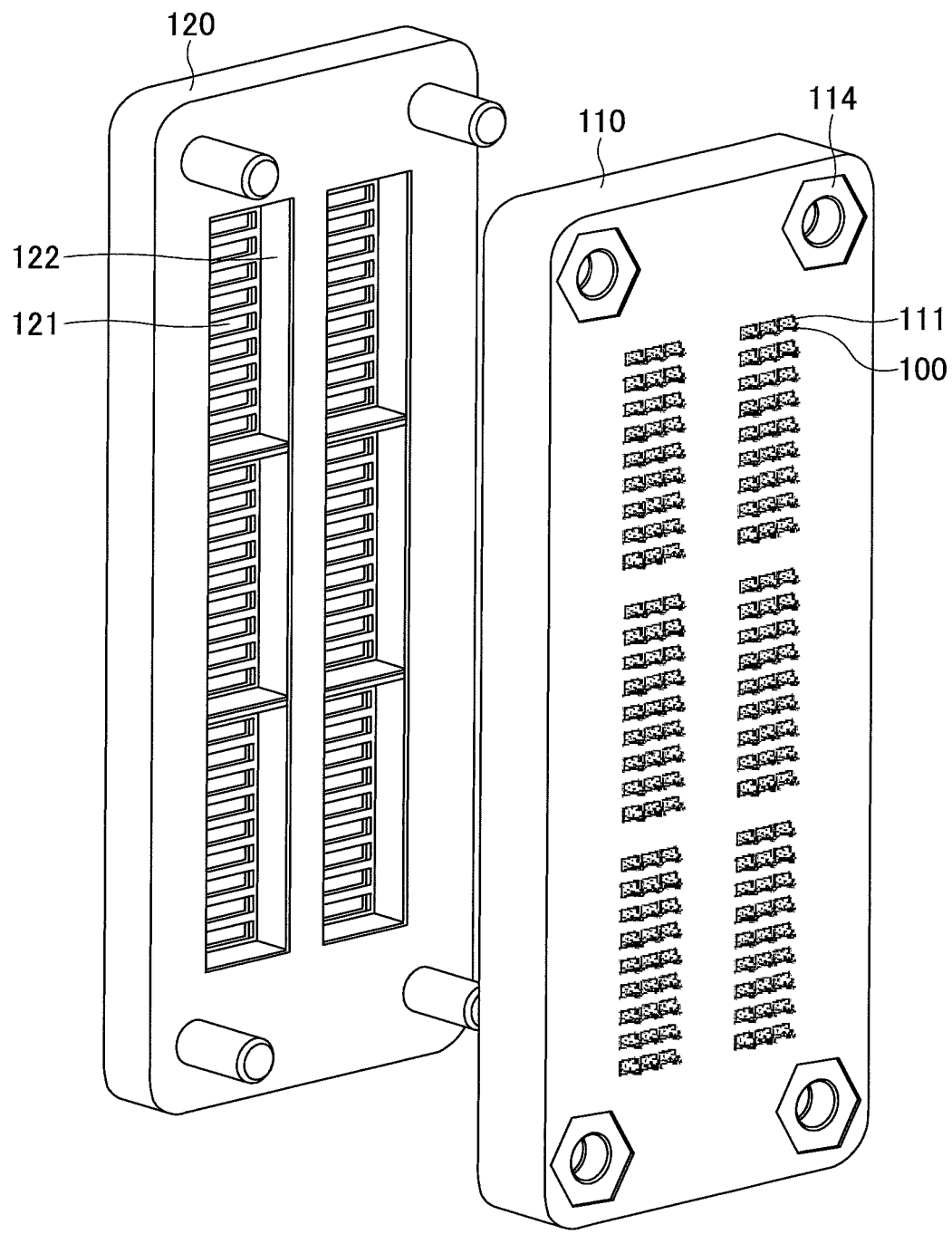
FIG. 20 is an exploded front-side perspective view of the connector according to the second embodiment.
Figure 21:
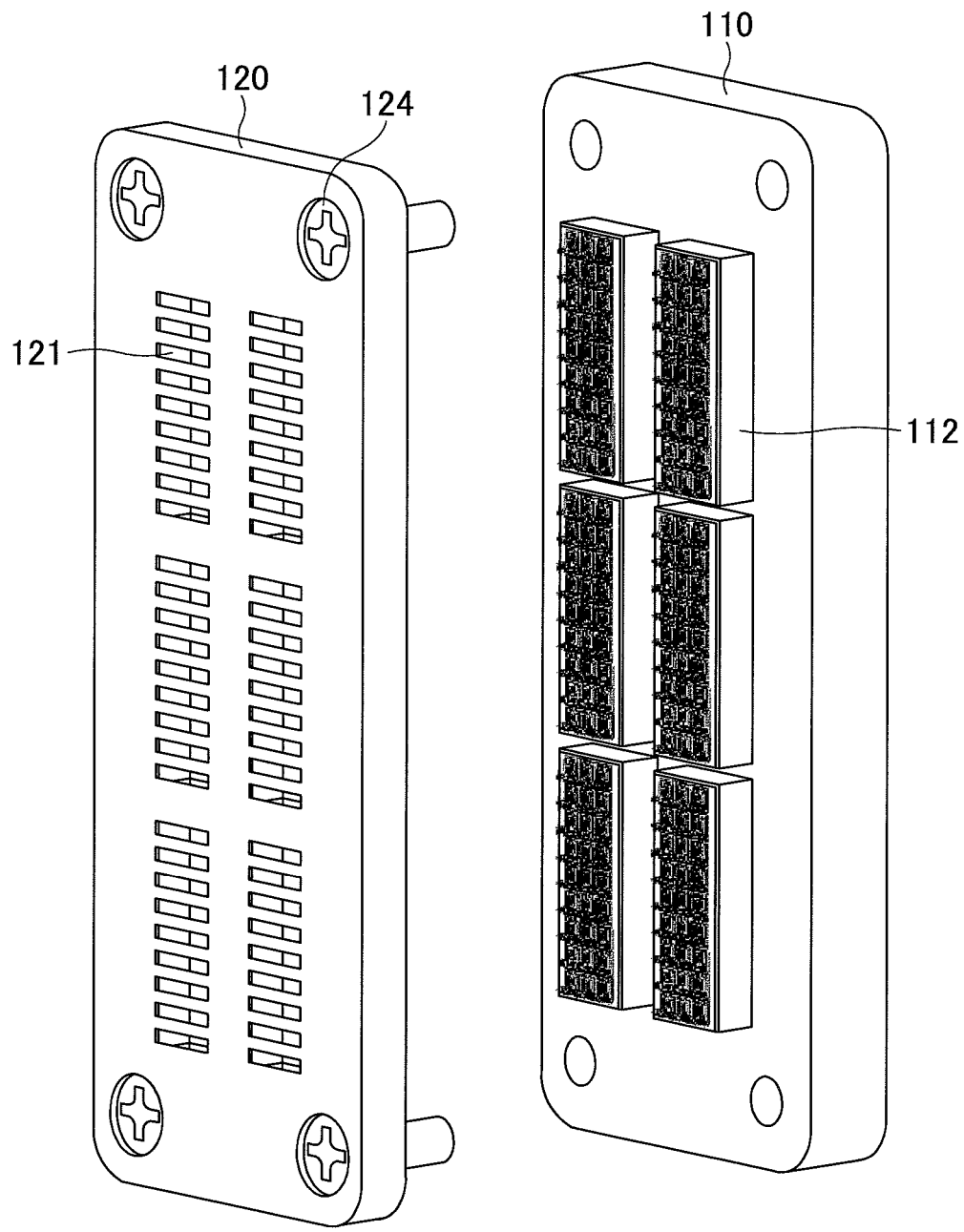
FIG. 21 is an exploded rear-side perspective view of the connector according to the second embodiment.

FIG. 10 is a front view of the connector according to this embodiment. FIG. 11 is a rear view of the connector according to this embodiment. FIG. 12 is a side view of the connector according to this embodiment. FIG. 13 is a plan view of the connector according to this embodiment. FIG. 14 is a front-side perspective view of the connector according to this embodiment. FIG. 15 is a rear-side perspective view of the connector according to this embodiment. FIG. 16 is an enlarged view of the connector at an opening 111 according to this embodiment. FIG. 17 is an enlarged view of the connector at an opening 121 according to this embodiment. FIG. 18 is a perspective view of the connector with a part of the connector cut off (removed) according to this embodiment. FIG. 19 is a cross-sectional view of the connector according to this embodiment. FIG. 20 is an exploded front-side perspective view of the connector according to this embodiment. FIG. 21 is an exploded rear-side perspective view of the connector according to this embodiment.

The first insulator part 110 and the second insulator part 120, which form a housing in the connector of this embodiment, are formed of insulators. In the connector of this embodiment, the multiple probes 100 are two-dimensionally (vertically and horizontally or in a matrix when viewed in a plane) arranged with the terminal contact portions 11 of the end parts 10 being positioned in substantially the same plane and the electrode contact portions 52 of the bent parts 50 being positioned in substantially the same plane.

The probes 100 are fixed by the first insulator part 110 and the second insulator part 120. The first insulator part 110 is provided with the openings 111 corresponding to the probes 100, and projecting portions 112 (FIG. 21) for containing (accommodating) the probes 100 are provided inside the first insulator part 110. In the projecting portions 112, open regions (spaces) are defined so that the entirety of each probe 100 is substantially contained in the projecting portions 112. The openings 111 are provided at the bottom of the open regions.

On the other hand, the second insulator body 120 is provided with the laterally elongated rectangular openings 121 each provided for (shared by) two or more of the probes 100 provided (aligned) laterally in the drawings (for example, as illustrated in FIG. 11). The openings 121 are provided at the bottom of recesses 122 (FIG. 20) having a shape corresponding to the shape of the projecting portions 112 of the first insulator part 110.

The probes 100 are so provided as to have portions of their end parts 10 projecting from (exposed outside through) the openings 111 of the first insulator part 110 and have their bent parts 50 projecting from (exposed outside through) the openings 121 of the second insulator part 120.

In joining the first insulator part 110 and the second insulator part 120, the first insulator part 110 is screwed to the second insulator part 120 using screws 124 and nuts 114. This makes it possible to manufacture a connector having the multiple probes 100 with ease. In the drawings, threads on the screws 124 and the nuts 114 are omitted.

According to this embodiment, in each of the probes 100, the housing part 30 is provided with the connection rear part 37 and the connection front part 36 is provided between the end part 10 and the spring part 20. As a result, as illustrated in FIG. 19, when the first insulator part 110 and the second insulator part 120 are joined, the probes 100 are fixed inside the first insulator part 110 and the second insulator part 120 with the connection front parts 36 being in contact with an interior surface 115 of the first insulator part 110 and the connection rear parts 37 being in contact with an interior surface 125 of the second insulator part 120. In this state, the end parts 10 of the probes 100 are allowed to be extended and compressed in the longitudinal (lengthwise) direction of the probes 100, so that it is possible to ensure the connections of the contact terminal portions 11 (FIG. 16) of the probes 100 and electrode terminals to contact the terminal contact portions 11.

According to the connector of this embodiment, it is possible to provide multiple probes 100 at predetermined positions. Further, if there is a need for replacing one or more of the probes 100 because of damage or the like, the first insulator part 110 and the second insulator part 120 may be separated by disconnecting (disengaging) the nuts 114 and the screws 124. Therefore, it is possible to replace the probes 100 provided in the internal open regions of the projection portions 112 of the first insulator part 110 with ease.

[c] Third Embodiment

Next, a description is given of a third embodiment. This embodiment is a probe different in structure from the probe 100 of the first embodiment. Like the probe 100 of the first embodiment, a probe according to this embodiment is used for testing electronic parts or components or electric circuits, and is formed by bending a single metal plate, which may be blanked out of a metal plate formed of copper or an alloy containing copper. Accordingly, a probe according to this embodiment has a monolithic structure, continuous as a whole.

A description is given, with reference to FIG. 22 through FIG. 26, of a probe according to this embodiment. A probe 200 according to this embodiment includes an end part 210, a spring part 220, a housing part 230, and a bent part 250.

Figure 22:
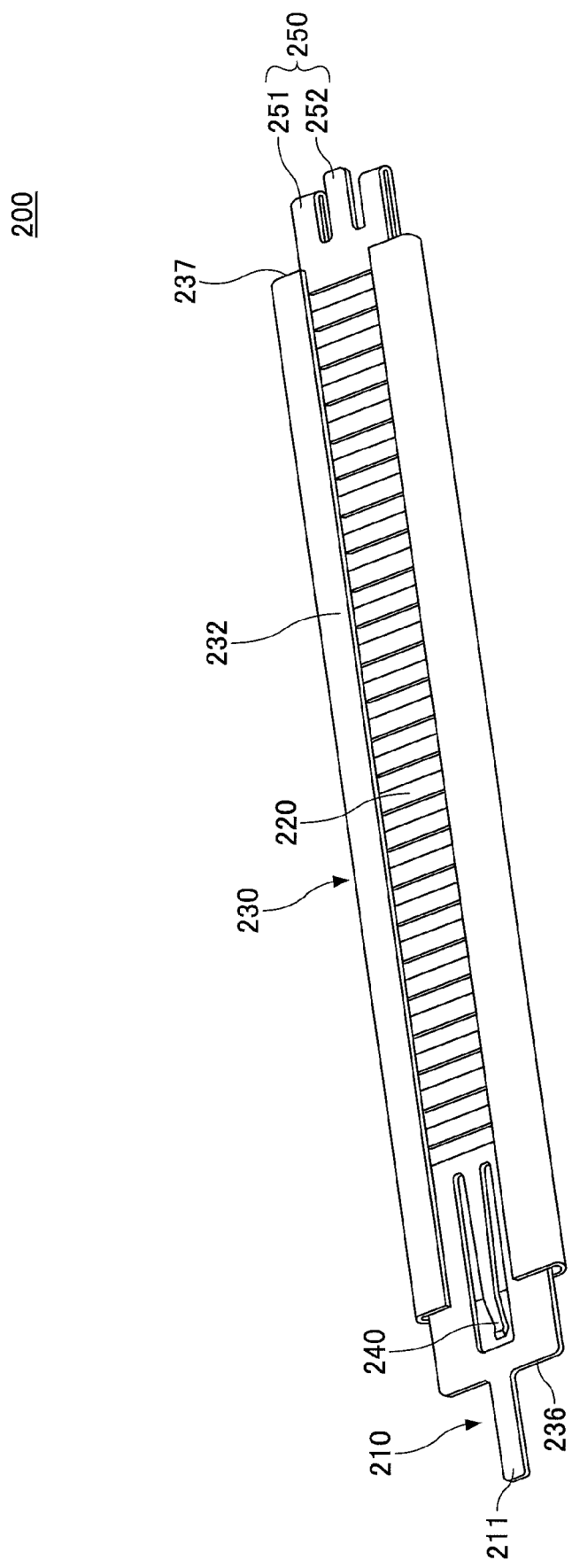
FIG. 22 is a perspective view of the exterior of a probe according to a third embodiment.
Figure 23:
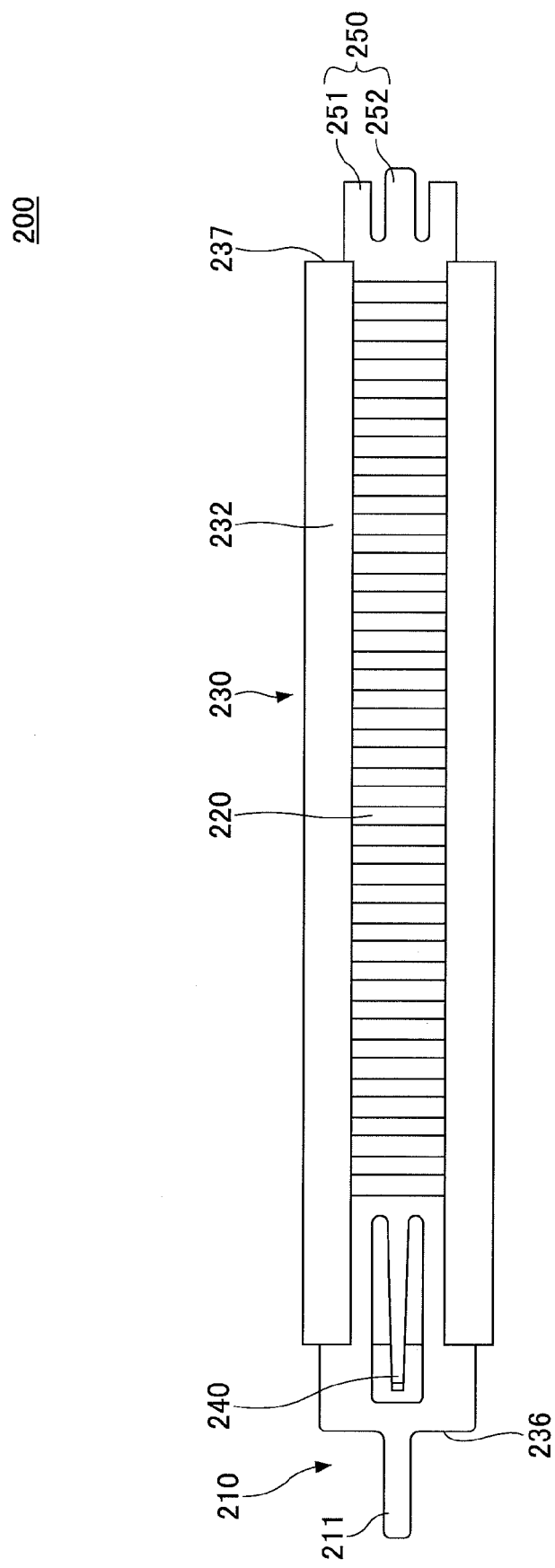
FIG. 23 is a plane view of the exterior of the probe according to the third embodiment.
Figure 24:
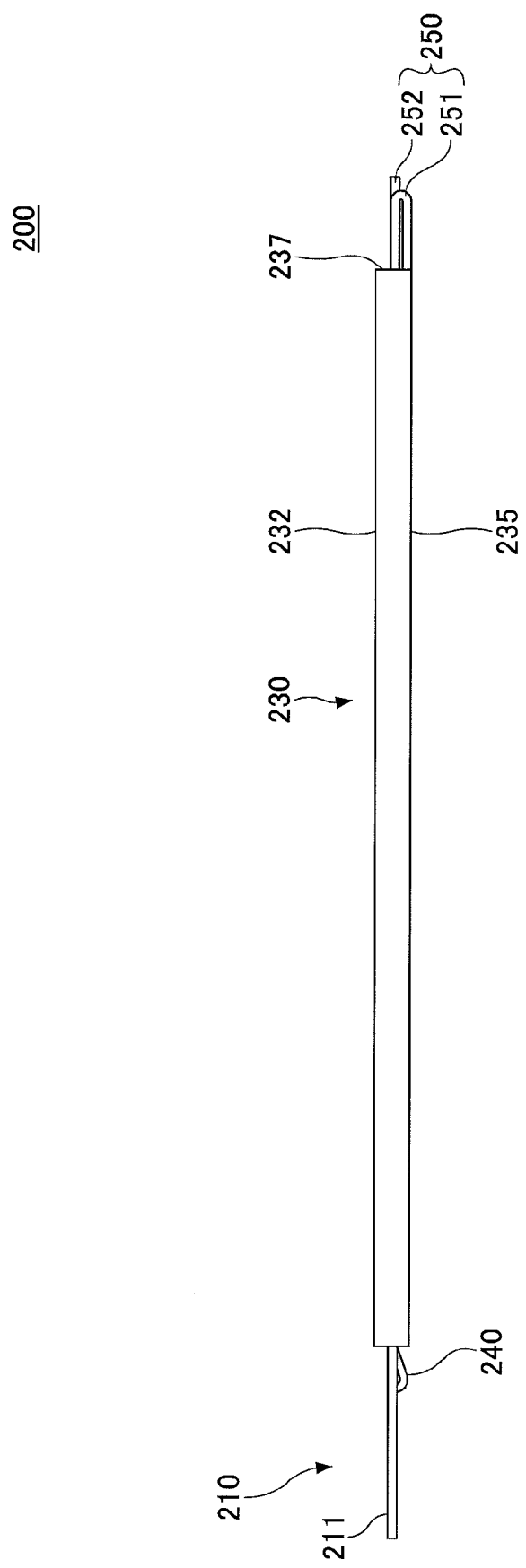
FIG. 24 is a side view of the exterior of the probe according to the third embodiment.
Figure 25:
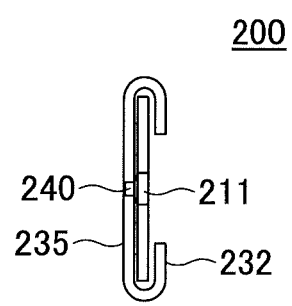
FIG. 25 is a front view of the exterior of the probe according to the third embodiment.
Figure 26:
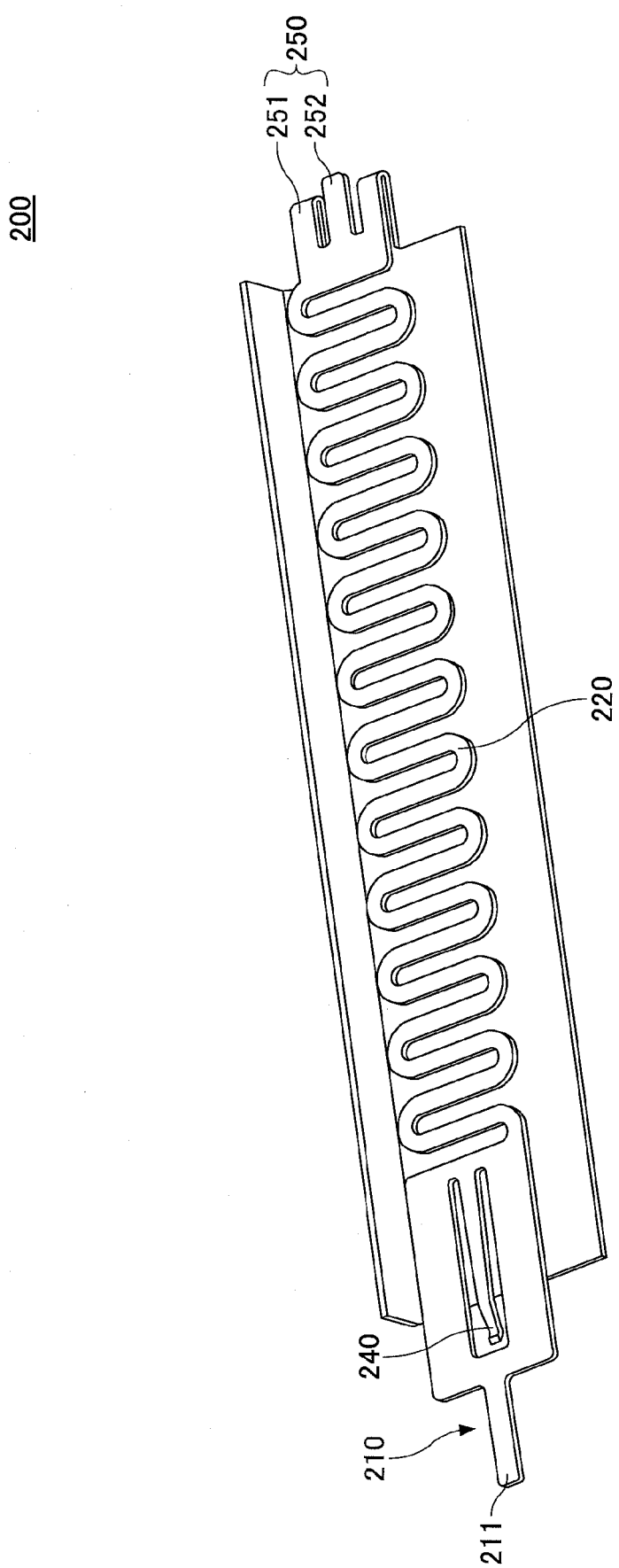
FIG. 26 is a diagram illustrating the probe according to the third embodiment.

FIG. 22 is a perspective view of the probe 200 according to this embodiment. FIG. 23 is a plane view of the probe 200 according to this embodiment. FIG. 24 is a side view of the probe 200 according to this embodiment. FIG. 25 is a front view of the probe 200 according to this embodiment. FIG. 26 is a diagram illustrating an intermediate state of the probe 200 before forming the housing part 230 by bending during its manufacturing process.

The end part 210 is configured to come into contact with and electrically connect to an electrode pad or an electrode terminal of an electric circuit or an electronic component formed on a wafer. The end portion of the end part 210 defines a terminal contact portion 211. The terminal contact portion 211 is a part to come into contact with and electrically connect to an electrode pad or an electrode terminal in an electric circuit or an electronic component to be tested.

The spring part 220 has a meandering plate shape, making U-letter curves (having U-shaped portions) on each side along its lengthwise direction. This allows the spring part 220 to have elasticity and to function as a spring.

The housing part 230 is formed by bending a region (part) of the metal plate which region is to become the housing part 30 so that the bent region encloses the entire spring part 220. The housing part 230 includes a top surface portion 232 and a bottom surface portion 235. For example, the top surface portion 232 is formed by bending the region to become the housing part 230, which forms the bottom surface portion 235 at the same time. This allows the entire spring part 220 to be enclosed with the housing part 230 having the top surface portion 232 and the bottom surface portion 235.

The bent part 250 connects the housing part 230 and the spring part 220, serving as a boundary between the housing part 230 and the spring part 220. The bent part 250 is bent approximately 180°, so that the spring part 220 is contained in the housing part 230. The bent part 250 is configured to be electrically connected to a measuring apparatus such as a prober. An electrode signal obtained at the terminal contact portion 211 by its contact with an electrode pad or an electrode terminal is transmitted to the measuring apparatus via the bent part 250. The bent part 250 includes a bent portion 251, which is bent approximately 180°, and an electrode contact portion 252 to come into contact with an electrode terminal. The electrode signal is transmitted to the measuring apparatus via the electrode contact portion 252.

According to this embodiment, the probe 200 includes a housing connecting part 240, projecting toward the housing part 230 side, provided between the spring part 220 and the end part 210. The housing connecting part 240 is configured to come into contact with the inside of the housing 230 so that the housing connecting part 240 and the housing part 230 are electrically connected when the terminal contact part 211 is pressed toward the housing part 230 side.

As a result of this electrical connection between the inside of the housing part 230 and the housing connecting part 240, an electrical signal is transmitted from the terminal contact portion 211 of the end part 210 to the bent part 250 via the housing connecting part 240, provided between the spring part 220 and the end part 210, and the housing part 230.

The housing part 230 has a large cross-sectional area in a region where the electrical signal flows. This makes it possible to reduce the electrical resistance between the terminal contact portion 211 and the bent part 250. Accordingly, it is possible to transmit an electrical signal detected at the terminal contact portion 211 to the bent part 250 with low resistance. That is, according to the probe 200 of this embodiment, the electrical connection (contact) made inside the probe 200 is limited to where the inside of the bottom surface portion 235 of the housing part 230 and the housing connecting part 240 are electrically connected. Therefore, the probe 200 is low in contact resistance, so that the probe 200 is low in electrical resistance.

It is preferable that the housing connecting part 240 be provided on the end part 210 side in the probe 200. This is because it is possible to transmit an electrical signal detected at the contact terminal portion 211 with low resistance by causing the electrical signal to be transmitted as much through the housing part 230 as possible since the housing part 230 has such a large cross-sectional area in a region where the electrical signal flows as to allow the electrical signal to flow with low resistance.

According to the probe 200 of this embodiment, the housing part 230 formed of the top surface portion 232 and the bottom surface portion 235 has a flat shape. This allows the probes 200 to be arranged with higher density in a "stacking" direction of the housing parts 230 (that is, a direction in which the top surface portions 232 or the bottom surface portions 235 of the housing parts 230 are oriented).

Such a probe according to this embodiment may be used for a memory tester, a test of liquid crystal panels, and a probe for a board test, and may replace a probe pin that is also called a "pogo pin".

Figure 27:
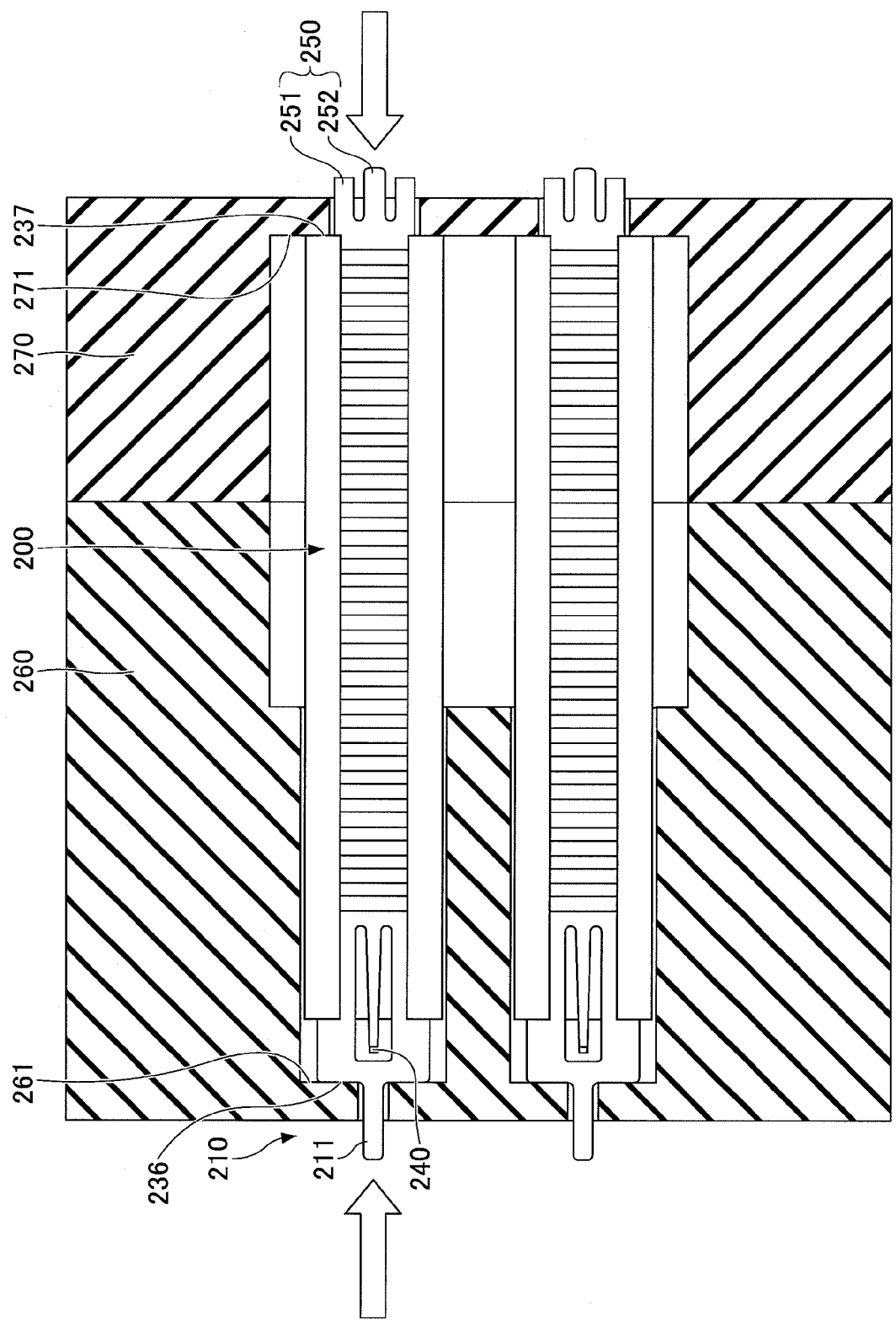
FIG. 27 is a diagram illustrating a connector using the probe according to the third embodiment.

The probes 200 of this embodiment may form a connector similar to the connector in the second embodiment. That is, according to this embodiment, in each of the probes 200, the housing part 230 is provided with a connection rear part 237, and a connection front part 236 is provided between the end part 210 and the spring part 220. As a result, as illustrated in FIG. 27, when a first insulator part 260 and a second insulator part 270 are joined, the probes 200 are fixed inside the first insulator part 260 and the second insulator part 270 with the connection front parts 236 being in contact with an interior surface 261 of the first insulator part 260 and the connection rear parts 237 being in contact with an interior surface 271 of the second insulator part 270. In this state, the end parts 210 of the probes 200 are allowed to be extended and compressed in the longitudinal (lengthwise) direction of the probes 200, so that it is possible to ensure the connections of the contact terminal portions 211 of the probes 200 and electrode terminals to contact the terminal contact portions 211.

According to the connector of this embodiment, it is possible to provide the multiple probes 200 at predetermined positions. Further, if there is a need for replacing one or more of the probes 200 because of damage or the like, the first insulator part 260 and the second insulator part 270 may be separated with ease by, for example, employing the same joining mechanism as the connector of the second embodiment using the nuts 114 (for example, FIG. 10) and the screws 124 (for example, FIG. 11). Therefore, it is possible to replace the probes 100 with ease.

[Method of Manufacturing Probe]

Figure 28:
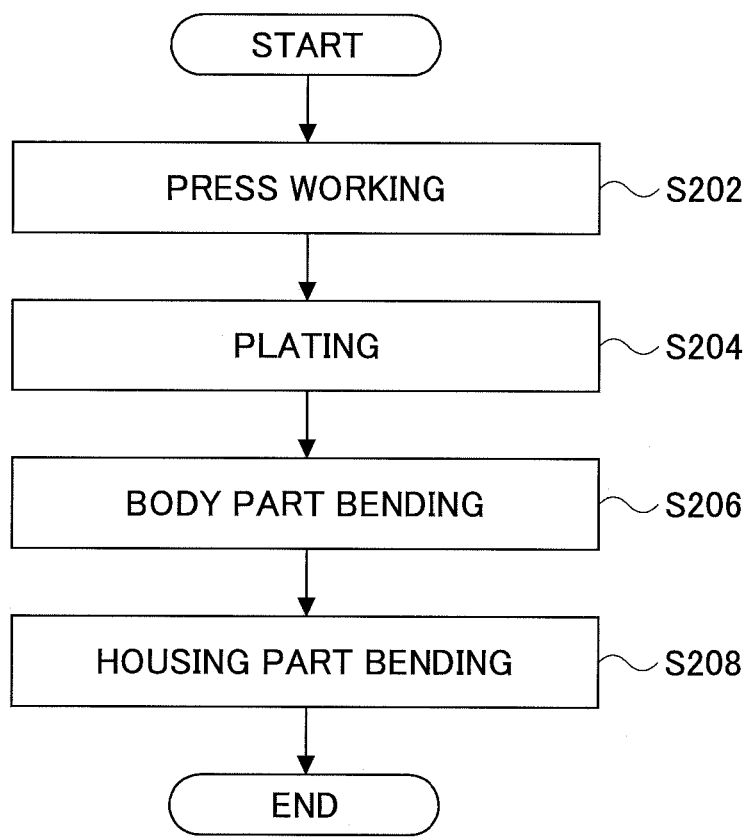
FIG. 28 is a flowchart of a method of manufacturing a probe according to the third embodiment.

Next, a description is given, with reference to FIG. 28, of a method of manufacturing a probe according to this embodiment.

First, in step S202, a metal plate is formed (processed) into a predetermined shape in order to manufacture a probe according to this embodiment (a metal plate forming process). The metal plate may be blanked out by press working or be formed by forming a mask of a predetermined shape on a metal plate and etching out a region of the metal plate where the mask is not formed. This metal plate is formed of copper or an alloy containing copper, and is 30 μm to 150 μm in thickness. According to this embodiment, the metal plate of a predetermined shape is formed by press working using a copper plate of 60 μm in thickness. In this embodiment, this metal plate before being processed into a probe is referred to as a body part.

Next, in step S204, the body part for forming a probe according to this embodiment is subjected to plating (a plating process). This plating is performed by successively performing Ni plating, Pd plating, and Au plating or successively performing Ni plating and Au plating.

Next, in step S206, the body part for forming a probe according to this embodiment is bent (a first bending process). The body part is bent at the bent portion 251 of the bent part 250.

Next, in step S208, a region of the body part to become the housing part 230 is bent (a second bending process). For example, a region of the body part to become the top surface portion 232 of the region to become the housing part 230 is bent substantially 180° to cover the spring part 220, so that the top surface portion 232 and the bottom surface portion 235 of the housing part 230 are simultaneously formed. As a result, the entire spring part 220 is enclosed by the housing part 230. The probe according to this embodiment may be manufactured in this manner.

Thus, a probe according to this embodiment may be formed by processing a single metal plate. Accordingly, a probe having a spring function may be manufactured without assembling multiple parts or components, thus requiring no assembling process. Further, as stated earlier, the manufacturing process may be composed of a processing process such as press working on a metal plate, a plating process, and bending processes. Therefore, a probe according to this embodiment may be manufactured with a simple manufacturing apparatus. Further, since the manufacturing process is simple, it is possible to manufacture a large number of probes in a short period of time at low cost. Accordingly, it is possible to manufacture a probe having a spring function at extremely low cost.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A connector, comprising:
a plurality of probes; and
a first insulator part and a second insulator part joined to cover the probes,
wherein each of the probes has a monolithic structure of a single bent metal plate,
each of the probes including
an end part configured to come into contact with an electrode terminal;
a spring part having a meandering shape and connected to the end part;
a housing part bent to enclose the spring part; and
a bent part provided between the spring part and the housing part, and
the end parts of the probes are at least partially projecting outward from first openings provided in the first insulator part, and the bent parts of the probes are at least partially projecting outward from second openings provided in the second insulator part.

2. The connector as claimed in claim 1, wherein each of the second openings in the second insulator part is provided in correspondence to two or more of the probes.

3. The connector as claimed in claim 1, wherein:
the first insulator part includes a projecting portion accommodating the probes,
the second insulator part includes a recess having a shape corresponding to a shape of the projecting portion, and
the first insulator part and the second insulator part are opposed and joined to each other to sandwich the probes so that the probes are fixed by the first insulator part and the second insulator part.

4. The connector as claimed in claim 1, wherein the probes are two-dimensionally arranged.

5. The connector as claimed in claim 1, wherein each of the probes is formed by bending the single metal plate in which a first region to become the end part, a second region to become the spring part, a third region to become the bent part, and a fourth region to become the housing part continue from a first end to a second end of the single metal plate.

6. The connector as claimed in claim 1, wherein:
each of the probes includes a housing connecting part connected to the end part, and
the housing connecting part is configured to come into contact with the housing part so that an electrical signal obtained at the end part is transmitted to the housing part via the housing connecting part.

7. The connector as claimed in claim 1, wherein:
the first insulator part has a plurality of projecting parts projecting on a contact surface thereof contacting a contact surface of the second insulator part, and
the projecting parts engage corresponding holes on the contact surface of the second insulator part so that the first insulator part and the second insulator part are positioned relative to each other.

8. A connector, comprising:
a plurality of probes, the probes each including
an end part configured to come into contact with an electrode terminal;
a spring part having a meandering shape and connected to the end part;
a housing part bent to enclose the spring part; and
a bent part provided between the spring part and the housing part,
wherein the end part, the spring part, the housing part, and the bent part are formed in a single bent metal plate and continue from a first end to a second end of the single bent metal plate; and
a first insulator part and a second insulator part joined to cover the probes,
wherein the end parts of the probes are at least partially projecting outward from first openings provided in the first insulator part, and the bent parts of the probes are at least partially projecting outward from second openings provided in the second insulator part.

* * * * *